(12) United States Patent
Mallikararjunaswamy

(10) Patent No.: US 7,933,102 B2
(45) Date of Patent: *Apr. 26, 2011

(54) CIRCUIT CONFIGURATIONS TO REDUCE SNAPBACK OF A TRANSIENT VOLTAGE SUPPRESSOR

(75) Inventor: Shekar Mallikararjunaswamy, San Jose, CA (US)

(73) Assignee: Alpha & Omega Semiconductor, Ltd., Sunnyvale, CA (US)

( * ) Notice: Subject to any disclaimer, the term of this patent is extended or adjusted under 35 U.S.C. 154(b) by 16 days.

This patent is subject to a terminal disclaimer.

(21) Appl. No.: 12/454,333

(22) Filed: May 15, 2009

(65) Prior Publication Data

US 2009/0262476 A1    Oct. 22, 2009

Related U.S. Application Data

(62) Division of application No. 11/444,555, filed on May 31, 2006, now Pat. No. 7,538,997.

(51) Int. Cl.
*H02H 9/00* (2006.01)
(52) U.S. Cl. .......................................................... 361/56
(58) Field of Classification Search ..................... 361/56
See application file for complete search history.

(56) References Cited

U.S. PATENT DOCUMENTS

| 4,798,975 A * | 1/1989 | Walczak et al. ............ 327/97 |
| 6,898,061 B1 * | 5/2005 | Kimber et al. ............. 361/56 |
| 7,538,997 B2 * | 5/2009 | Mallikararjunaswamy .... 361/56 |

\* cited by examiner

*Primary Examiner* — Stephen W Jackson
(74) *Attorney, Agent, or Firm* — Bo-In Lin

(57) ABSTRACT

This invention discloses an electronic device formed as an integrated circuit (IC) wherein the electronic device further includes a transient voltage suppressing (TVS) circuit. The TVS circuit includes a triggering Zener diode connected between an emitter and a collector of a bipolar-junction transistor (BJT) wherein the Zener diode having a reverse breakdown voltage BV less than or equal to a BVceo of the BJT where BVceo stands for a collector to emitter breakdown voltage with base left open. The TVS circuit further includes a rectifier connected in parallel to the BJT for triggering a rectified current through the rectifier for further limiting an increase of a reverse blocking voltage. In a preferred embodiment, the triggering Zener diode, the BJT and the rectifier are formed in a semiconductor substrate by implanting and configuring dopant regions of a first and a second conductivity types in a N-well and a P-well whereby the TVS can be formed in parallel as part of the manufacturing processes of the electronic device.

18 Claims, 9 Drawing Sheets

CIRCUIT CONFIGURATIONS TO REDUCE SNAPBACK OF A TRANSIENT VOLTAGE SUPPRESSOR

This Patent Application is a Divisional Application and claims the Priority Date of a application Ser. No. 11/444,555 filed on May 31, 2006 now U.S. Pat. No. 7,538,997 by common Inventors of this Application. The Disclosures made in the patent application Ser. No. 11/444,555 are hereby incorporated by reference.

BACKGROUND OF THE INVENTION

1. Field of the Invention

The invention relates generally to a circuit configuration and method of manufacture of a transient voltage suppressor (TVS). More particularly, this invention relates to an improved circuit configuration and method of manufacture of a transient voltage suppressor (TVS) with greatly reduced snapback.

2. Description of the Relevant Art

The transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

FIG. 1A-1 shows a typical commercially available two-channel TVS array 10. There are two sets of steering diodes, i.e., diodes 15-H and 15-L and 20-H and 20-L respectively for each of the two input/output (I/Os) terminals I/O-1 and I/O-2. Furthermore, there is a Zener diode, i.e., diode 30, with a larger size to function as an avalanche diode from the high voltage terminal, i.e., terminal Vcc, to the ground voltage terminal, i.e., terminal Gnd. At a time when a positive voltage strikes on one of the I/O pads, the high side diodes 15-H and 20-H provide a forward bias and are clamped by the large Vcc-Gnd diodes, e.g., the Zener diode 30. The steering diodes 15-H and 15-L and 20-H and 20-L are designed with a small size to reduce the I/O capacitance and thereby reducing the insertion loss in high-speed lines such as fast Ethernet applications. FIG. 1A-2 shows the reverse current IR versus reverse blocking voltage characteristics of the two-channel between the Vcc and the ground voltage of the TVS 10 shown in FIG. 1A-1. The reverse current IR as that shown in the diagram of FIG. 1A-2 represents a reverse current conducted through the Zener diode, i.e., between Vcc and GND. Here it is assumed that the reverse BV of each steering diode is higher than the reverse BV of the Zener diode. But note that at high currents when the Vcc to Gnd pad voltage is equal or higher than the summation of the reverse BV of the steering diodes then the current would also flow through all the two series steering diode paths. Since the Zener diode has higher resistance per unit area compared with BJT or SCR and BJT this is actually a disadvantage at higher currents because the steering diodes also have to be rugged in reverse conduction. In the case of the SCR+BJT the Zener clamp voltage is lower at higher currents and hence the steering diodes paths will not conduct. The breakdown voltage of the Vcc-Gnd diode 30 and the steering diodes 15 and 20 should be greater than the operating voltage (Vrwm) so that these diodes only turn-on during the voltage transients. The problem with the Vcc-Gnd clamp diodes is that typically these diodes are very resistive in reverse blocking mode and require large area to reduce resistance. As shown in FIG. 1A-2, the high resistance leads to the increase of BV at high current. This is not desirable as high BV not only causes the break down of steering diodes as described above but also causes damage to the circuit the TVS device intends to protect. The requirement to have large diode size thus limits further miniaturization of a device when such TVS circuit is implemented.

One common method used in the integrated circuits to circumvent this drawback is to use a Zener triggered NPN as the clamp device as that shown in FIG. 1B-1. The TVS circuit 50 shown in FIG. 1B-1 comprises a NPN bipolar transistor 55 connected in parallel to a Zener diode 60 to function as a Zener triggered NPN bipolar TVS device. FIG. 1B-2 shows a current-voltage (IV) diagram for the Zener triggered NPN diode device. FIG. 1B-2 illustrates that when the collector voltage of the NPN 55 reaches the breakdown voltage of the Zener diode 60, the NPN bipolar turns-on and snaps back to a lower voltage called the BVceo or holding voltage where BVceo stands for collector to emitter breakdown voltage with base left open. However, in a device that implements a TVS circuit, the snap-back phenomenon is not desirable. The snap-back creates a sudden drop of the reverse voltage that often causes the circuit oscillations due to negative resistance.

Therefore, a need still exists in the fields of circuit design and device manufactures for providing a new and improved circuit configuration and manufacturing method to resolve the above-discussed difficulties. Specifically, a need still exists to provide new and improved TVS circuits that can perform good voltage clamping function, occupying smaller areas and eliminating or reducing snapback voltage variations.

SUMMARY OF THE PRESENT INVENTION

It is therefore an aspect of the present invention to provide an improved TVS circuit to have an improved clamping. It is therefore a further aspect of the present invention to provide an improved TVS circuit to reduce the voltage-drop in a reverse-blocking voltage snap-back when a reverse current transmitted over a Zener diode triggers and turns on an NPN bipolar transistor. The TVS circuits disclosed in this invention thus resolve the difficulties caused by increasing break down voltage due to TVS device resistance and drastic voltage drop due to a snapback that commonly occurs in the conventional TVS circuit.

Moreover, it is another aspect of the present invention to provide an improved device design and manufacturing method to provide an improved TVS circuit. Specifically, most commercially available TVS are manufactured using a discrete process or older bipolar technology. However, this new TVS can be integrated into mainstream CMOS or Bi-CMOS technology allowing future single chip TVS protected ICs. Integration comes with lower cost protected ICs.

Briefly in a preferred embodiment this invention discloses a transient voltage suppressing (TVS) circuit for suppressing a transient voltage. The transient voltage suppressing (TVS) circuit includes a triggering diode, such as a Zener diode, connected between an emitter and a collector of a first bipolar-junction transistor (BJT) wherein the Zener diode having a reverse breakdown voltage BV less than or equal to a BVceo of the BJT where BVceo stands for a collector to emitter breakdown voltage with base left open. The TVS further includes a second BJT configured with the first BJT to function as a silicon controlled rectifier (SCR) wherein the first BJT triggers a SCR current to transmit through the SCR for further limiting an increase of a reverse blocking voltage caused by a transient voltage. In an exemplary preferred embodiment, the first BJT further includes a NPN bipolar junction transistor (BJT). In another preferred embodiment, the triggering diode and the BJT with the SCR are integrated as a semiconductor integrated circuit (IC) chip. In another preferred embodiment, the Zener diode triggering the first BJT for transmitting a current through the first BJT in a BJT mode and turning on the SCR at a higher reverse current than an initial current transmitting through the first BJT.

In another preferred embodiment, the present invention further discloses an electronic device formed as an integrated circuit (IC) wherein the electronic device further includes a transient voltage suppressing (TVS) circuit. The TVS circuit includes a triggering diode connected between an emitter and a collector of a first bipolar-junction transistor (BJT) wherein the triggering diode having a reverse breakdown voltage BV less than or equal to a BVceo of the first BJT where BVceo stands for a collector to emitter breakdown voltage with base left open. The TVS circuit further includes a second BJT connected in parallel to the first BJT forming a SCR for conducting current through the SCR for further limiting an increase of a reverse blocking voltage. In a preferred embodiment, the triggering diode, the first BJT and the SCR are formed in a semiconductor substrate by implanting and configuring dopant regions of a first and a second conductivity types in a N-well and a P-well whereby the TVS can be formed in parallel as part of the manufacturing processes of the electronic device.

The present invention further discloses a method for manufacturing an electronic device with an integrated transient voltage suppressing (TVS) circuit. The method includes a step of connecting a triggering diode between an emitter and a collector of a first bipolar-junction transistor (BJT) with the triggering diode having a reverse breakdown voltage BV less than or equal to a BVceo of the first BJT where BVceo stands for a collector to emitter breakdown voltage with base left open. The method further includes a step of connecting a second BJT in parallel to the first BJT for SCR function to conduct current through the SCR for further limiting an increase of a reverse blocking voltage. In a preferred embodiment, the step of connecting the SCR further comprising a step of connecting a second silicon controlled rectifier (SCR) anode for conducting a SCR current when triggered for current conduction at higher reverse current These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 1B-1 is a circuit diagram for showing another conventional TVS device and FIG. 1B-2 is an I-V diagram for illustrating the reverse characteristics of the TVS device with the voltage presents a sudden snap-back voltage drop at the time when a current conduction over the NPN bipolar transistor is triggered.

FIGS. 3A and 3B are cross sectional view along lines A-A' and B-B' respectively.

DETAILED DESCRIPTION OF THE METHOD

Figure 2A:
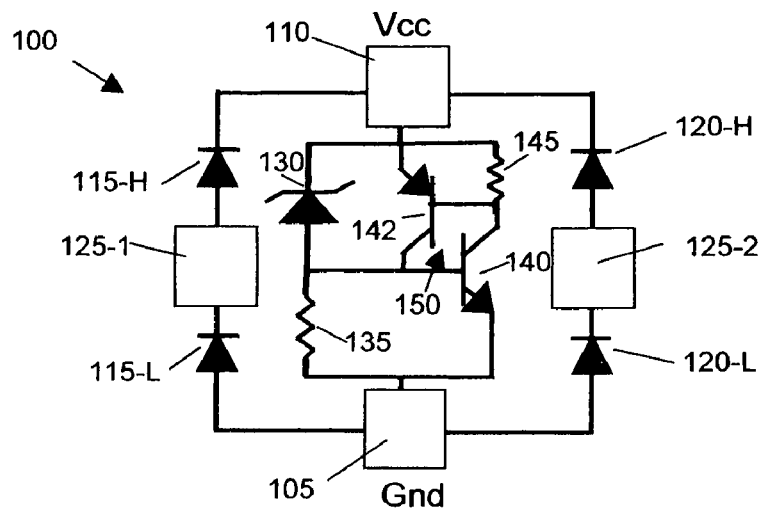
FIG. 2A is a circuit diagram for showing a TVS circuit of this invention and FIG. 2B is an I-V diagram for illustrating the reverse characteristics of the TVS device with significantly reduced snap back voltage drops.
Figure 2B:
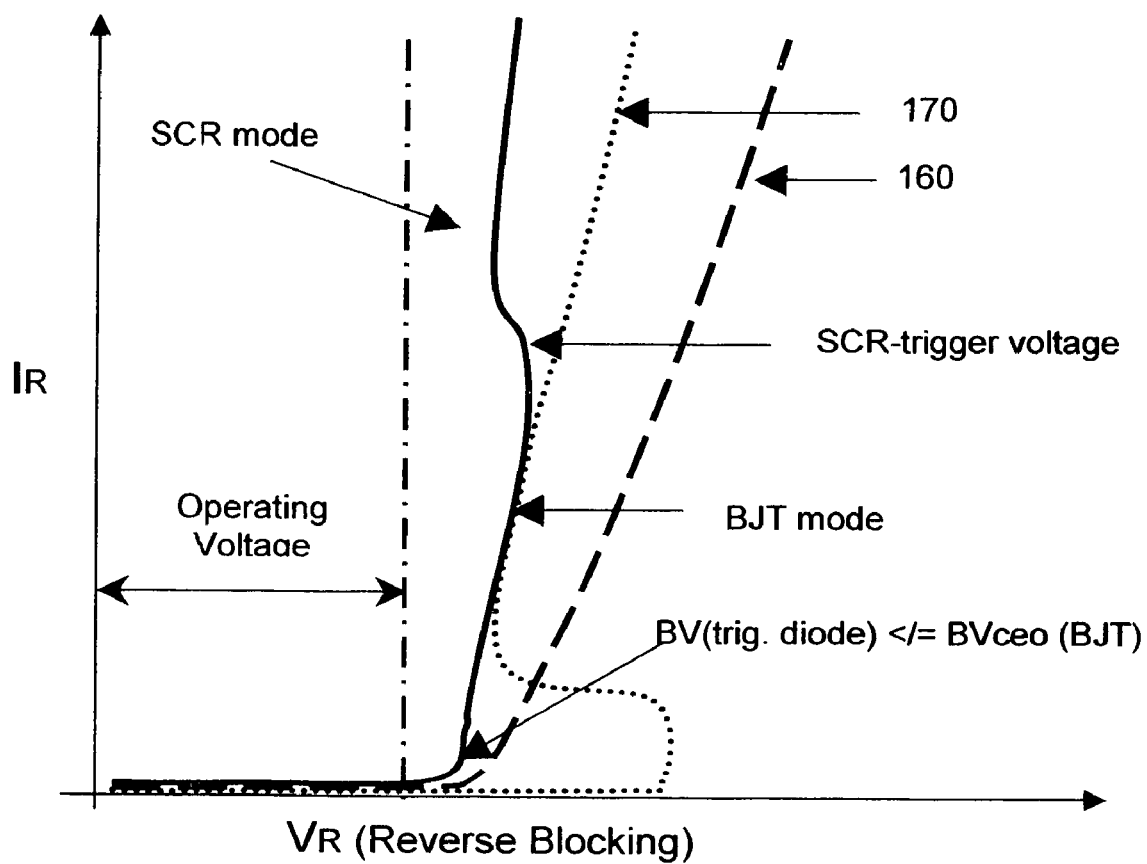

Referring to FIGS. 2A and 2B for a circuit diagram and an I-V diagram, i.e., a current versus voltage diagram, respectively of a TVS circuit 100 of this invention. The TVS circuit 100 is installed between a ground voltage terminal (Gnd) 105 and a Vcc voltage terminal 110 to function as a Vcc-Gnd clamp circuit. The TVS circuit 100 includes two sets of steering diodes, i.e., diodes 115-H and 115-L and 120-H and 120-L respectively for each of the two input/output (I/Os) terminals 125-1 and 125-2. Furthermore, there is a Zener diode, i.e., diode 130, with a larger size to function as an avalanche diode from the high voltage terminal, i.e., terminal Vcc, to the ground voltage terminal, i.e., terminal Gnd. The Zener diode 130 is connected in series with a resistor 135 and in parallel to a NPN bipolar transistor 140. A PNP bipolar transistor 142 in configured with NPN bipolar transistor 140 forms a PNPN silicon-controlled rectifier (SCR) structure 150 with high holding current and voltage. The breakdown voltage, i.e., BV, of the triggering diode 130 is less than or equal to the BVceo of the NPN bipolar transistor 140 where BVceo stands for collector to emitter breakdown voltage with the base left open.

$$BV(\text{Trigger Diode}) \leq BVceo$$

Figures 1, 1A:
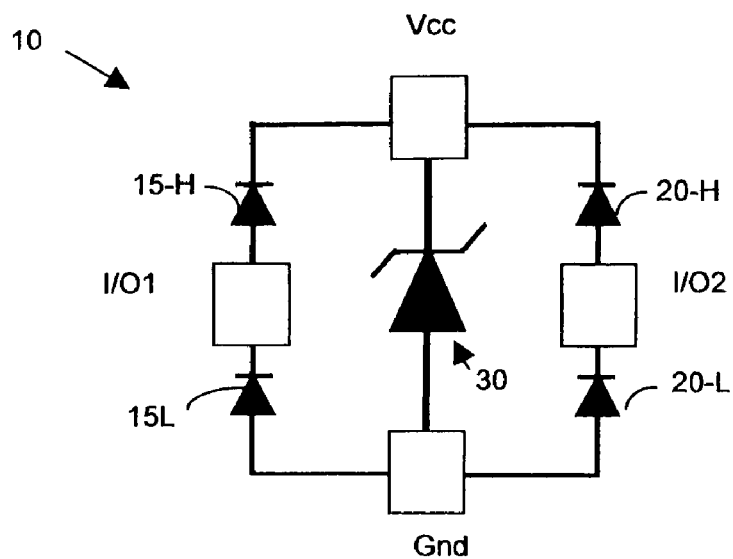
FIG. 1A-1 is a circuit diagram for showing a conventional TVS device and FIG. 1A-2 is an I-V diagram, i.e., a current versus voltage diagram, for illustrating the reverse characteristics of the TVS device.
Figures 1, 1A, 2:
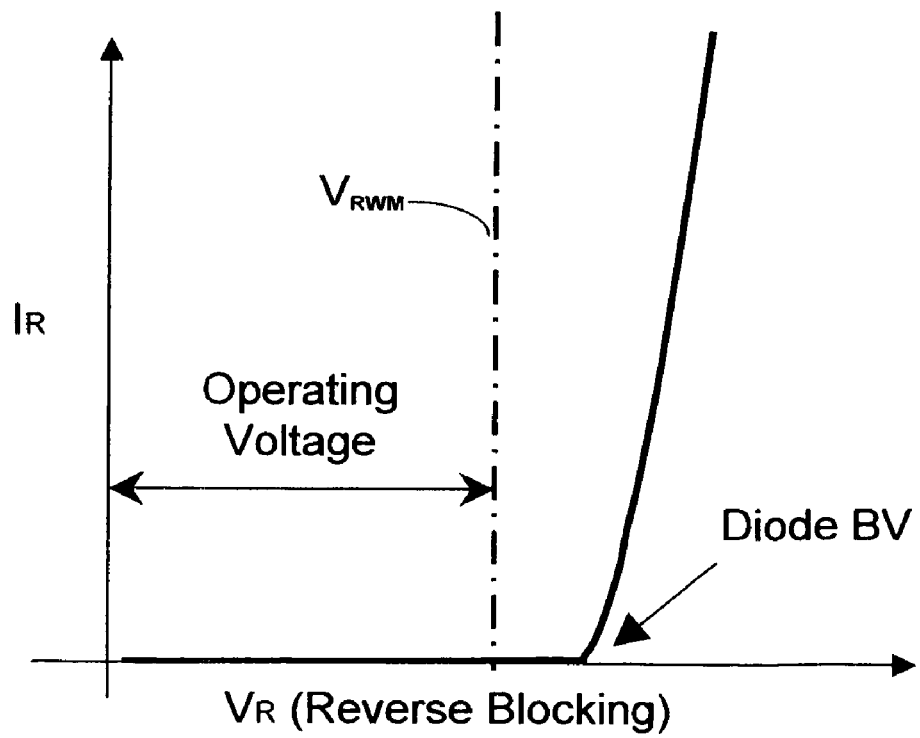
Figures 1, 1B:
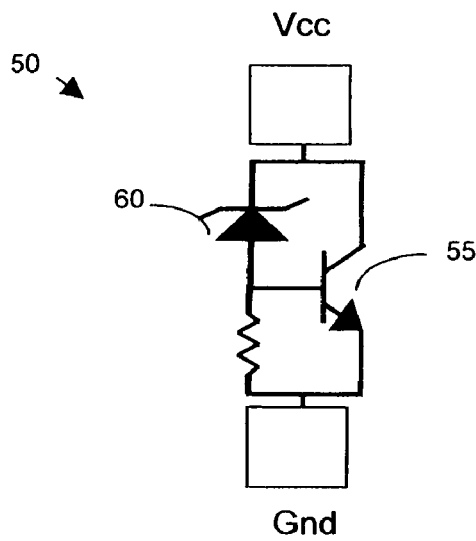
Figures 1, 1B, 2:
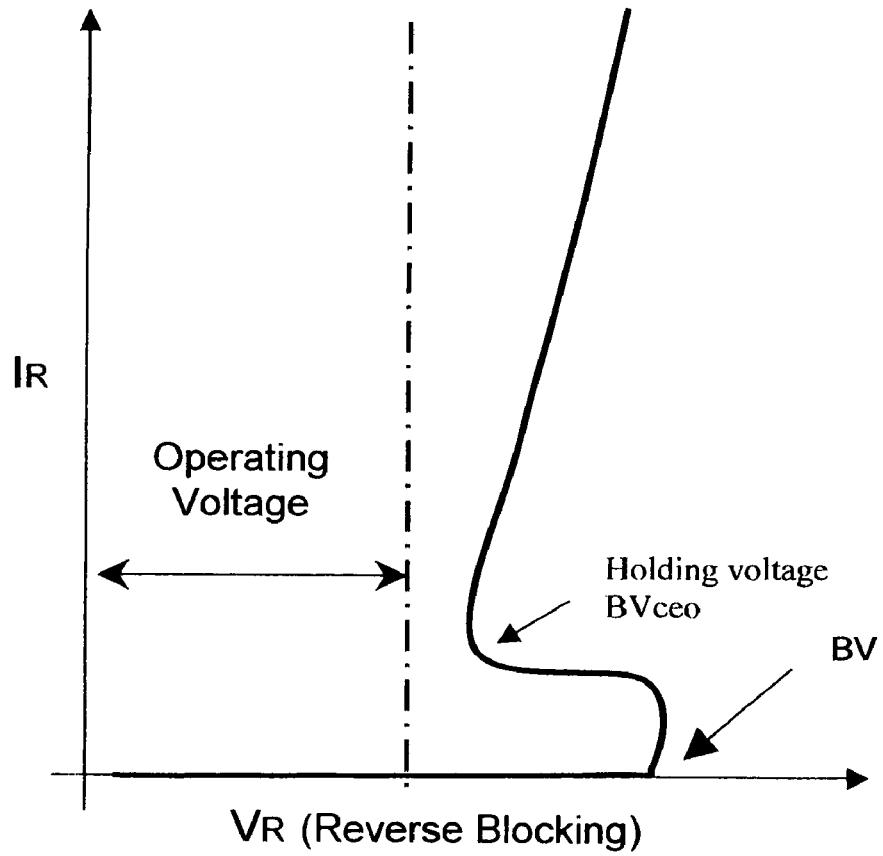

FIG. 2B is a current versus voltage diagram for comparing the operational characteristics of the TVS according to FIG. 2A and the conventional TVS. As a transient voltage higher than a normal operating voltage is applied to the TVS circuit, a reverse current is triggered to pass through the Zener diode 130 because the breakdown voltage BV of the trigger diode 130 is adjust to less than the BVceo. As the voltage increases, the device migrates into BJT mode where the NPN 140 conducts. When the voltage increases further the SCR 150 is activated and begins to conduct current. The turning on of the SCR causes a slight drop of the reverse blocking voltage VR. FIG. 2B also shows the I-V diagrams, i.e., curve 160 for diode TVS of FIG. 1A-1, and curve 170 for BJT TVS of FIG. 1B-1. In contrast to curves 160 and 170, by adjusting BV of trigger diode less than the BVceo, the voltage snap back problems are resolved. The sequence of operation mode provides the benefit of fast response as the NPN transistor turns on fast. Furthermore, by turning on the SCR 150 at a SCR trigger voltage to protect the NPN bipolar transistor 140, the increase of BV at high current is minimized as the SCR action incurs the least resistance. This resolves the difficulties of high BV at high current that not only causes the break down of steering diodes but also cause damage to the circuit the TVS device intends to protect.

The detail operation of the TVS system can be further understood from the following descriptions. Typically the TVS is biased in a system with the high voltage terminal Vcc and the ground voltage Gnd connected to the system which needs protection. There are also applications where the Vcc is left floating for specific applications. Then a +Ve or −Ve zap is applied to the I/O terminals with respect to Gnd. When a +Ve zap is applied on I/O the upper diodes are forward biased and when the voltage reaches the trigger diode BV then current flows through the resistor 135 in series with the trigger diode 130. When the drop in the resistor 135 reaches a voltage of 0.6V then the base-emitter junction of the NPN transistor 140 is forward biased and the NPN transistor 140 turns-on. Now the collector current of the NPN transistor flows through the resistor connected between the emitter and base of the PNP transistor 142. When the potential drop in this resistor 145 reaches a voltage of 0.6V then the emitter of the PNP transistor 142 begins to conduct and the SCR action is initiated. So now the current flows from the anode on the PNP 142 transistor, i.e., the emitter of PNP, to the cathode of the NPN transistor 140, i.e., the emitter of the NPN. On the negative zap the bottom diode turns-on in forward conduction between I/O pad and Gnd and ESD current flows only in this diode path. There is also a condition when a voltage zap is applied to the Vcc at a voltage of +Ve with respect to Gnd. Under this zap condition the current flows through the Vcc-Gnd path, i.e., there is no current conducted in the steering diodes, since the trigger diode breaks down and initiates the SCR as described above.

Figure 3A:
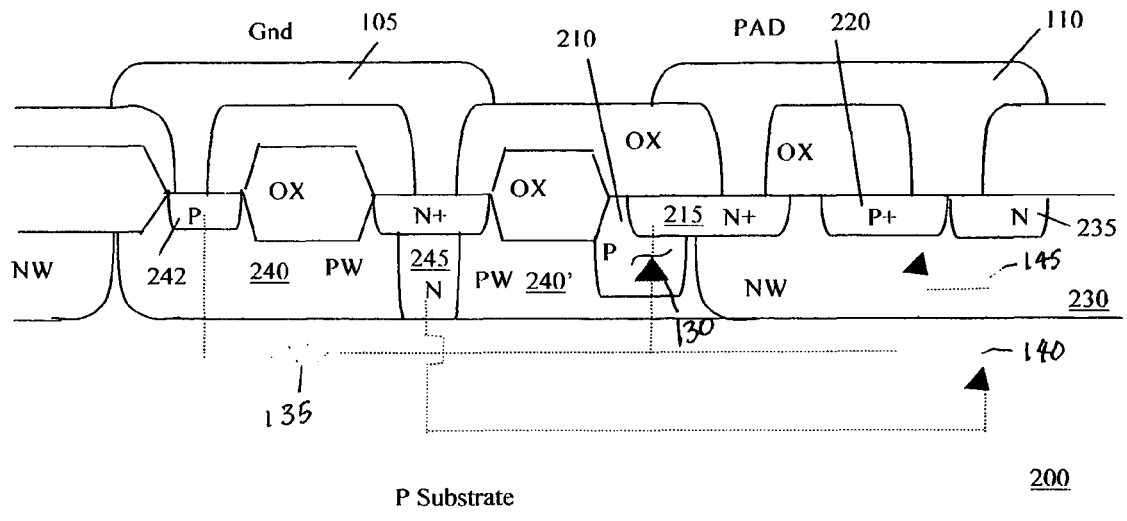
FIGS. 3A to 3D are side cross sectional views of circuit components of the TVS device of FIG. 2A supported on a semiconductor substrate for a low side diode, a high side diode and a clamp diode respectively.
Figure 3B:
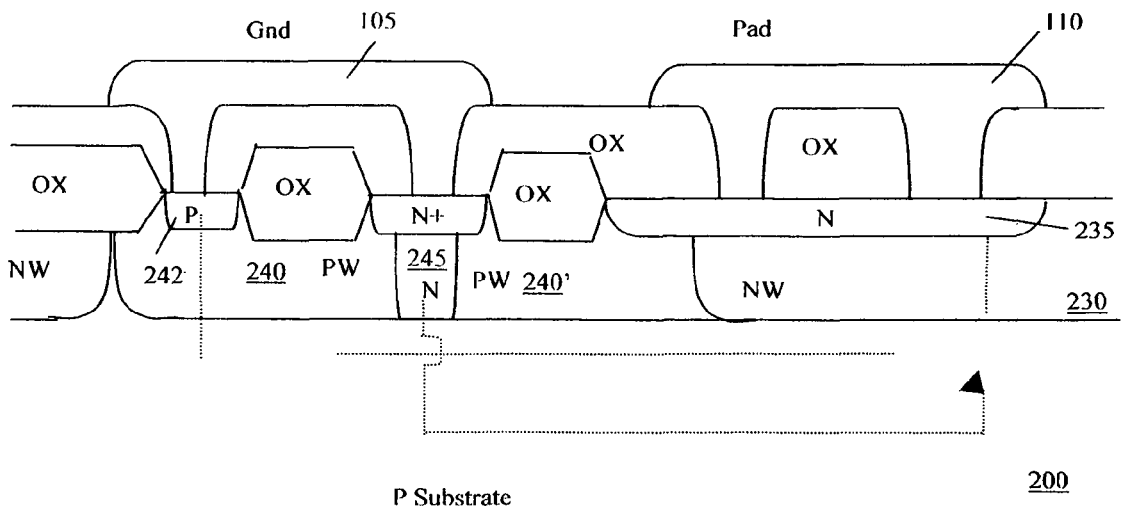

FIGS. 3A to 3D are a cross sectional views showing the typical TVS array that includes the improved trigger diode 130 integrated with NPN bipolar transistor 140 and the PNP bipolar transistor 142 forming SCR 150, and two sets of steering diodes 115-L, 115-H, and 120-L, 120-H. The new TVS array 100 as shown in FIGS. 3A to 3D are manufactured with mainstream CMOS technology. FIGS. 3A and 3B show a TVS array supported on a P substrate 200. A P type region 210 is placed next to an N+ region 215 forming a Zener diode 130 with cathode connecting to Vcc pad 110. A P+ region 220 also connects to Vcc pad 110. P+ region 220 disposed next to a N well region 230 above P substrate 200 forms PNP transistor 142, with P substrate 200 connecting to Gnd pad 105 through P well 240 and P region 242. The lateral path in P substrate 200 from N well 230 to P well 240 provides the resistance for resistor 135. The path from N region 235 to N well 230 provides resistance 145. The N-well 230 disposed above the P-substrate 200 in turn electrically contacting an N-region 245 thus constituting the NPN transistor 140. The P-type region 210 formed next to the N+ region 215 within P well 240 is to tailor the trigger breakdown voltage BV of the trigger diode 130, i.e., the diode formed between the P region 210 and the N+ region 215, to be less than or equal to the BVceo of the NPN transistor 140. The other way of tailoring the BV and BVceo is to increase the gradient of the N doping of N+ region 235 so that the collector to emitter breakdown voltage with the base left open (CEO) is tailored to the desired value. A combination of the two could also be used to get desired BV and BVceo.

Figure 3C:
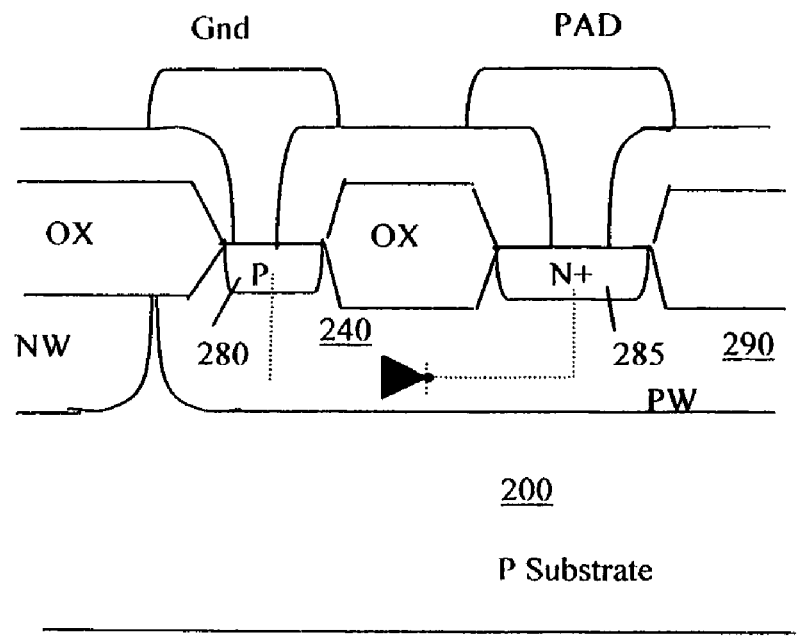
Figure 3D:
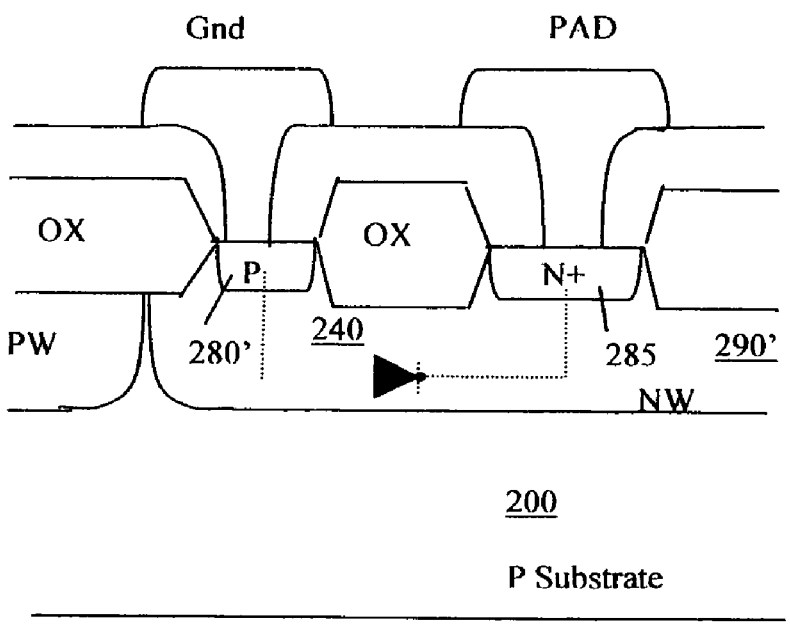

FIG. 3C shows the low side steering diode comprises a P+ region 280 and N+ region 285 encompassed in a P-well 290. FIG. 3D shows the high side steering diode comprises a P+ region 280' and N+ region 285' encompassed in a N-well 290'. For lowering the capacitance of these diodes and also increasing their BV, a lower doped N− region is added where N+ region is implanted so the process provides an N+/N−/PW diode instead of N+/PW diode. Similar for the high side diode, a P-implantation is added where P+ is so as to give a P+/P−/Nwell diode.

Figure 3E:
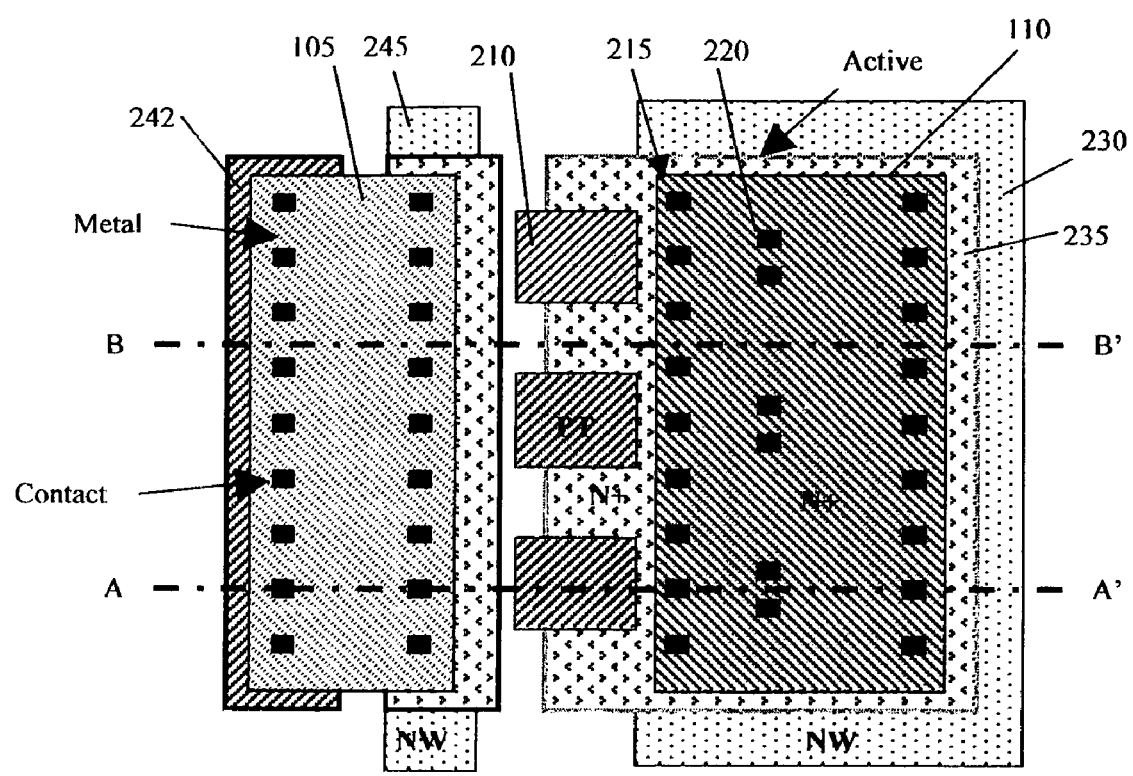
FIGS. 3E to 3G are top views of the TVS device for the device shown in FIGS. 3A, 3C and 3D respectively where
Figure 3F:
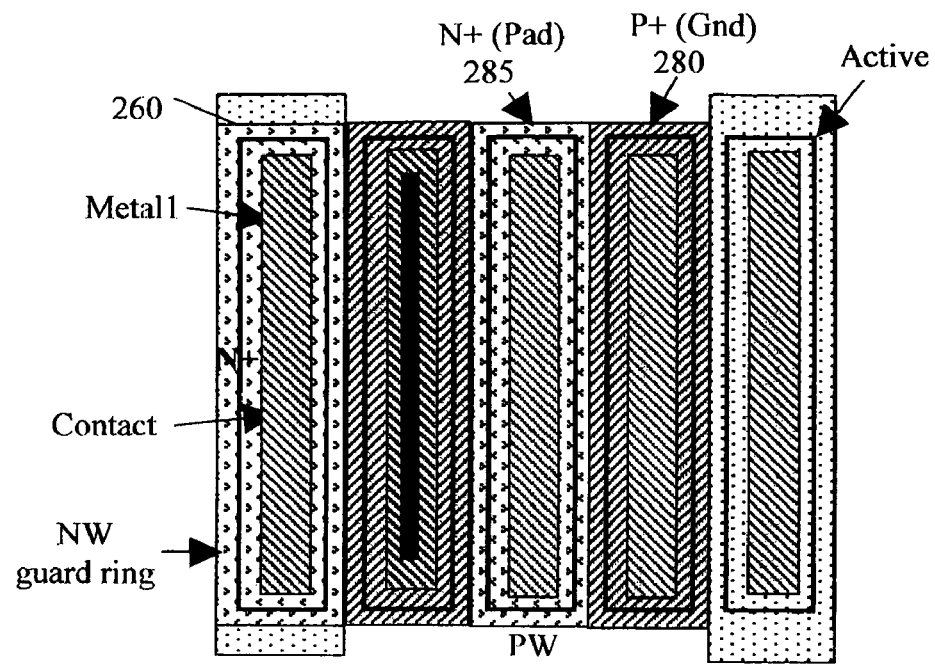
Figure 3G:
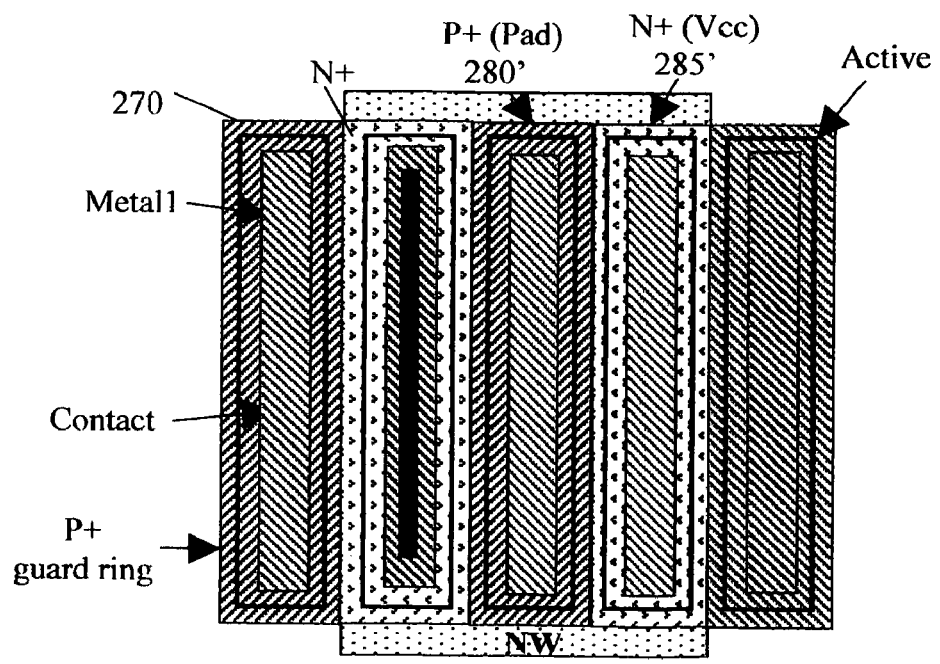

FIG. 3E is a top view of the TVS device according to the configurations shown in FIGS. 3A to 3D. The N+ and P+ diffusion regions 215 and 220 in FIG. 3A are masked by the active region. The NW 230 below the N+ regions 215 is connected to Gnd 105 that increases the base resistance of the NPN transistor and also helps to turn-on the SCR at high currents. The PT regions 210 used as anode of the trigger diode are staggered in the layout and cut line A-A' and B-B' cross-sections are shown in FIGS. 3A and 3B respectively. The P+ region 220 of the SCR anode region is also staggered in the layout to control the SCR holding current. The NW 230 under the P+ emitter 210 or anode forms the collector of the NPN transistor that forms part of the SCR. The top view layout of the low side and high side diodes are shown in FIGS. 3F and 3G. The N+/NW guard rings 260 and the P+/PW guard rings 270 are formed to suppress latch-up during ESD transients between I/Os and I/O to VCC.

Figure 4A:
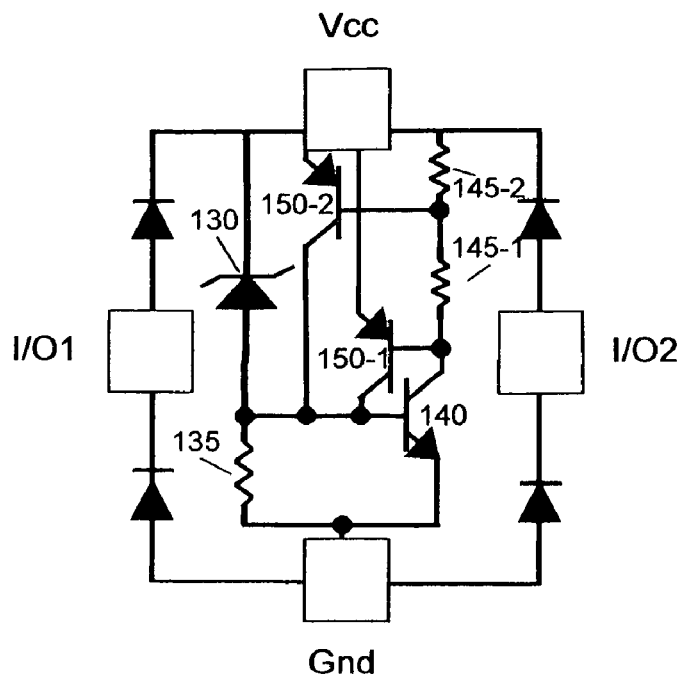
FIG. 4A is a circuit diagram for showing a TVS circuit implemented with a clamp diode with auxiliary P+ anode and FIG. 4B is a cross section view of the TVS circuit of FIG. 4A supported on a semiconductor device.
Figure 4B:
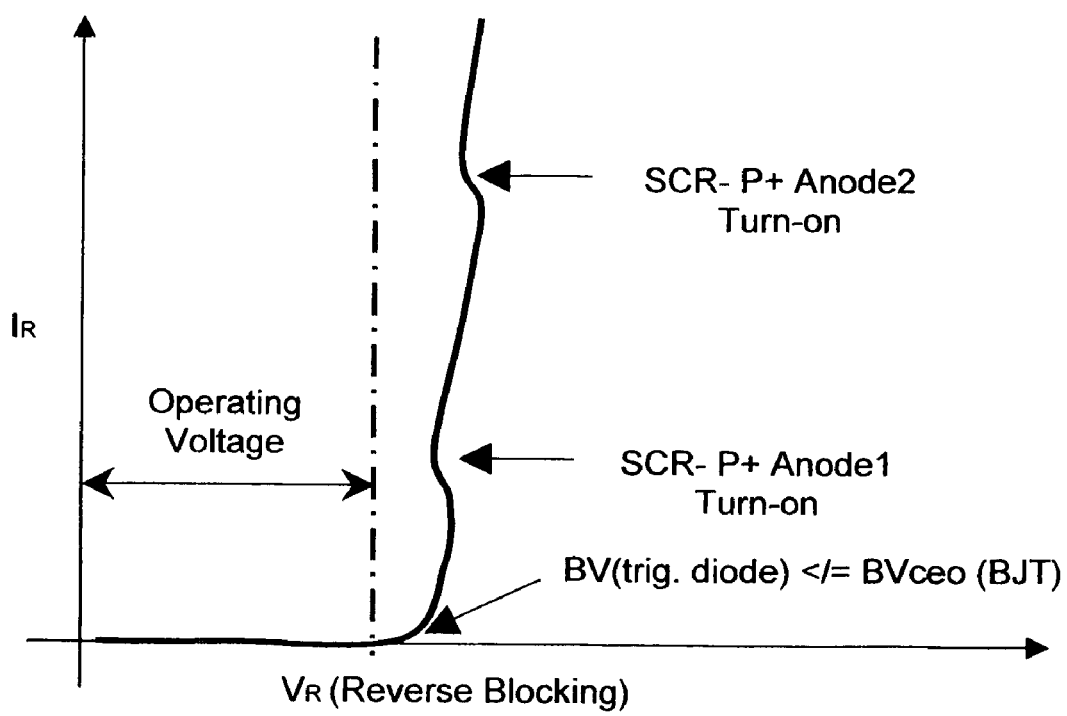
Figure 5:
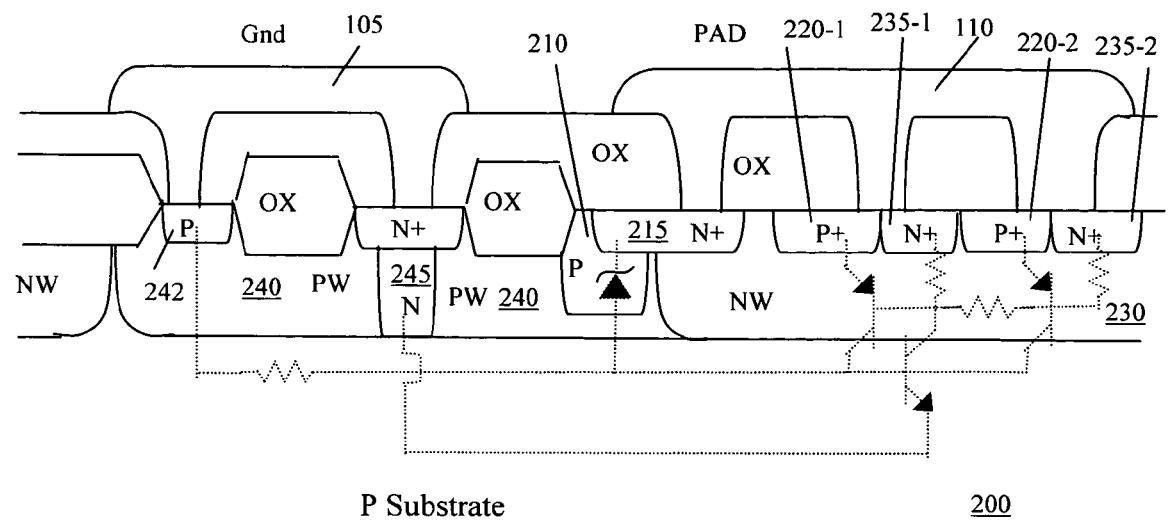
FIG. 5 is a cross sectional view of the TVS device shown in FIG. 4A.

FIGS. 4A and 4B are circuit diagram and I-V diagram respectively for showing an alternate embodiment with further improved clamp capabilities. The TVS system shown in FIG. 4A has similar circuit configuration as that shown in FIG. 2A except with two SCR anodes 150-1 and 150-2. By integrating multiple SCRs anode structures as shown in FIG. 4A provides the improved current handling and clamping capability as that shown in FIG. 4B. A cross-section of the multiple integrated SCRs anode structure is shown in FIG. 5. The operational principles and circuit connections are similar to that of FIG. 2A. Briefly, a transient voltage breaks down trigger diode 130. When the voltage drop at resistor 135 reaches 0.6 V the NPN transistor 140 turns on and current flows through resistors 145-1 and 145-2. When the combined voltage drop over resistors 145-1 and 145-2 reaches 0.6 V the first anode of SCR 150-1 is initiated. When the SCR current continue increase to the point the voltage drop over resistor 145-2 reaches 0.6 V the second anode of SCR kicks in. The number of SCR anodes can be increased to meet the need of protection circuit. The benefit of multiple SCR anodes provides the advantage that when each SCR anode kicks in, their corresponding snack-back forces the locking voltage close to the maximum claming voltage therefore provides an improved clamping.

According to FIGS. 3 and 4, this invention discloses an electronic device with the triggering diode and the SCR are integrated with the electronic device on a single chip. In a preferred embodiment, the triggering diode and the SCR are manufactured with a standard CMOS technology and integrated with the electronic device on a single chip. In another embodiment, the triggering diode and the SCR are manufactured with a standard Bi-CMOS technology and integrated with the electronic device on a single chip. In another embodiment, the TVS further includes a second SCR anode connected in parallel to a first SCR anode of the SCR and the first BJT triggering a SCR current at a higher reverse current for conducting the reverse current through the second SCR anode for further limiting an increase of a reverse blocking voltage. In another embodiment, the TVS further includes guard ring for suppressing a latch-up during an ESD transients between an I/O pad to a high voltage Vcc terminal. In another embodiment, the triggering diode, the SCR are formed in a semiconductor substrate by implanting and configuring dopant regions of a first and a second conductivity types in a N-well and a P-well whereby the TVS can be formed in parallel as part of the manufacturing processes of the electronic device.

With the above circuit diagrams and the device cross sections, the invention shows the TVS operations and array integration of the improved TVS devices. These TVS devices provide improved clamp protections that occupy smaller area and perform good clamping function because the SCRs are able to carry high currents with little voltage drop beyond trigger diode breakdown.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A transient voltage suppressing (TVS) circuit comprising:
   a triggering diode connected between an emitter and a collector of a first bipolar-junction transistor (BJT) wherein said triggering diode having a reverse breakdown voltage BV less than or equal to a BVceo of said BJT where BVceo stands for a collector to emitter breakdown voltage with base left open;
   a second BJT connected with said first BJT forming a silicon controlled rectifier (SCR) wherein said first BJT triggers a SCR for conducting a current there-through for further limiting an increase of a reverse blocking voltage; and
   a semiconductor substrate for supporting and forming said triggering diode and said SCR on said semiconductor substrate as an integrated circuit (IC) chip.

2. The transient voltage suppressing (TVS) circuit of claim 1 wherein:
   said first BJT further comprising a NPN bipolar junction transistor (BJT) comprising N doped regions and a P doped region is said semiconductor substrate.

3. The transient voltage suppressing (TVS) circuit of claim 1 wherein:
   said triggering diode comprising a Zener diode disposed in said semiconductor substrate.

4. The transient voltage suppressing (TVS) circuit of claim 1 wherein:
   said triggering diode triggering said first BJT for transmitting a current through said first BJT in a BJT mode and said first BJT triggers said SCR at a higher reverse current than an initial current transmitting through said first BJT.

5. The transient voltage suppressing (TVS) circuit of claim 1 further comprising:
   at least a steering diode connect in parallel to said triggering diode and said SCR for electrically connecting to an I/O terminal for steering a normal current between a high voltage and a low voltage terminal.

6. The transient voltage suppressing (TVS) circuit of claim 1 wherein:
   said triggering diode and said BJT with said SCR are manufactured with a standard CMOS technology on said semiconductor substrate as said integrated circuit (IC) chip.

7. The transient voltage suppressing (TVS) circuit of claim 1 wherein:
   said triggering diode and said BIT with said SCR are manufactured with a standard Bi-CMOS technology on said semiconductor substrate as said integrated circuit (IC) chip.

8. An electronic device formed as an integrated circuit (IC) wherein the electronic device further includes an transient voltage suppressing (TVS) circuit comprising:
   a triggering diode connected between an emitter and a collector of a first bipolar-junction transistor (BJT) wherein said triggering diode having a reverse breakdown voltage BV less than or equal to a BVceo of said BJT where BVceo stands for a collector to emitter breakdown voltage with base left open;
   a second BJT connected with said first BJT forming a silicon controlled rectifier (SCR) wherein said first BJT triggers a SCR for conducting a current there-through for further limiting an increase of a reverse blocking voltage; and
   a semiconductor substrate for supporting and forming said triggering diode and said SCR on said semiconductor substrate as an integrated circuit (IC) chip.

9. The electronic device of claim 8 wherein:
   said triggering diode comprising a Zener diode comprising N doped and P doped regions in said semiconductor substrate.

10. The electronic device of claim 8 wherein:
    said first BJT further comprising a NPN bipolar junction transistor (BJT) comprising N doped regions and a P doped region is said semiconductor substrate.

11. The electronic device of claim 8 wherein:
    said triggering diode triggering said first BJT for transmitting a current through said first BJT in a BJT mode and said first BJT triggers said SCR at a higher reverse current than an initial current transmitting through said first BJT.

12. The electronic device of claim 8 further comprising:
    at least a steering diode connect in parallel to said triggering diode and said SCR for electrically connecting to an I/O terminal for steering a normal current between a high voltage and a low voltage terminal.

13. The electronic device of claim 8 wherein:
    said triggering diode and said SCR are integrated with said electronic device in said semiconductor substrate as a single chip.

14. The electronic device of claim 8 wherein:
    said triggering diode and said SCR are manufactured with a standard CMOS technology and integrated with said electronic device in said semiconductor substrate as a single chip.

15. The electronic device of claim 8 wherein:
    said triggering diode and said SCR are manufactured with a standard Bi-CMOS technology and integrated with said electronic device in said semiconductor substrate as a single chip.

16. The electronic device of claim 8 wherein:
    said TVS further comprising a second SCR anode connected in parallel to a first SCR anode of said SCR and said first BJT further triggering a SCR current at a higher reverse current for conducting said reverse current through said second SCR anode for further limiting an increase of a reverse blocking voltage.

17. The electronic device of claim 8 wherein:
    said TVS further comprising guard ring disposed on edges of said semiconductor substrate for suppressing a latch-up during an ESD transients between an I/O pad to a high voltage Vcc terminal.

18. The electronic device of claim 8 wherein:
    said triggering diode, said SCR are formed in the semiconductor substrate by implanting and configuring dopant regions of a first and a second conductivity types in a N-well and a P-well whereby said TVS can be formed in parallel as part of the manufacturing processes of said electronic device and integrated on said semiconductor substrate as a single chip.

* * * * *